United States Patent [19]

Collins et al.

[11] Patent Number: 5,065,118

[45] Date of Patent: Nov. 12, 1991

[54] ELECTRONICALLY TUNED VHF/UHF MATCHING NETWORK

[75] Inventors: Kenneth S. Collins, Morgan Hill; Craig A. Roderick, San Jose, both of Calif.

[73] Assignee: Applied Materials, Inc., Santa Clara, Calif.

[21] Appl. No.: 558,290

[22] Filed: Jul. 26, 1990

[51] Int. Cl.$^5$ ............................................... H01P 5/04
[52] U.S. Cl. .................................... 333/33; 333/24.1; 333/160
[58] Field of Search .............. 333/160, 161, 156, 17.3, 333/32, 33, 24.1, 205, 207, 22 F, 24.2

[56] References Cited

U.S. PATENT DOCUMENTS 3,384,841  5/1968  Di Piazza ........................... 333/160

FOREIGN PATENT DOCUMENTS 1214333  4/1960  France .................................. 333/160
882121  11/1961  United Kingdom ................ 333/160

OTHER PUBLICATIONS

Moreno, *Microwave Transmission Design Data*, Dover Publ., N.Y., N.Y., 1948, title page and pp. 103–106.

Primary Examiner—Paul Gensler
Attorney, Agent, or Firm—Robert J. Stern; Douglas L. Weller; Paul L. Hickman

[57] ABSTRACT

A matching network matches an output impedance of a source with an input impedance of a load. The matching network includes a plurality of transmission line stubs. Each transmission line stub includes a first transmission line conductor, a second transmission line conductor running parallel to but not in electrical contact with the first transmission line conductor, and ferrite dielectric material between the first transmission line conductor and the second transmission line conductor. A magnetic field is used to vary the relative permeability of the ferrite dielectric material.

21 Claims, 3 Drawing Sheets

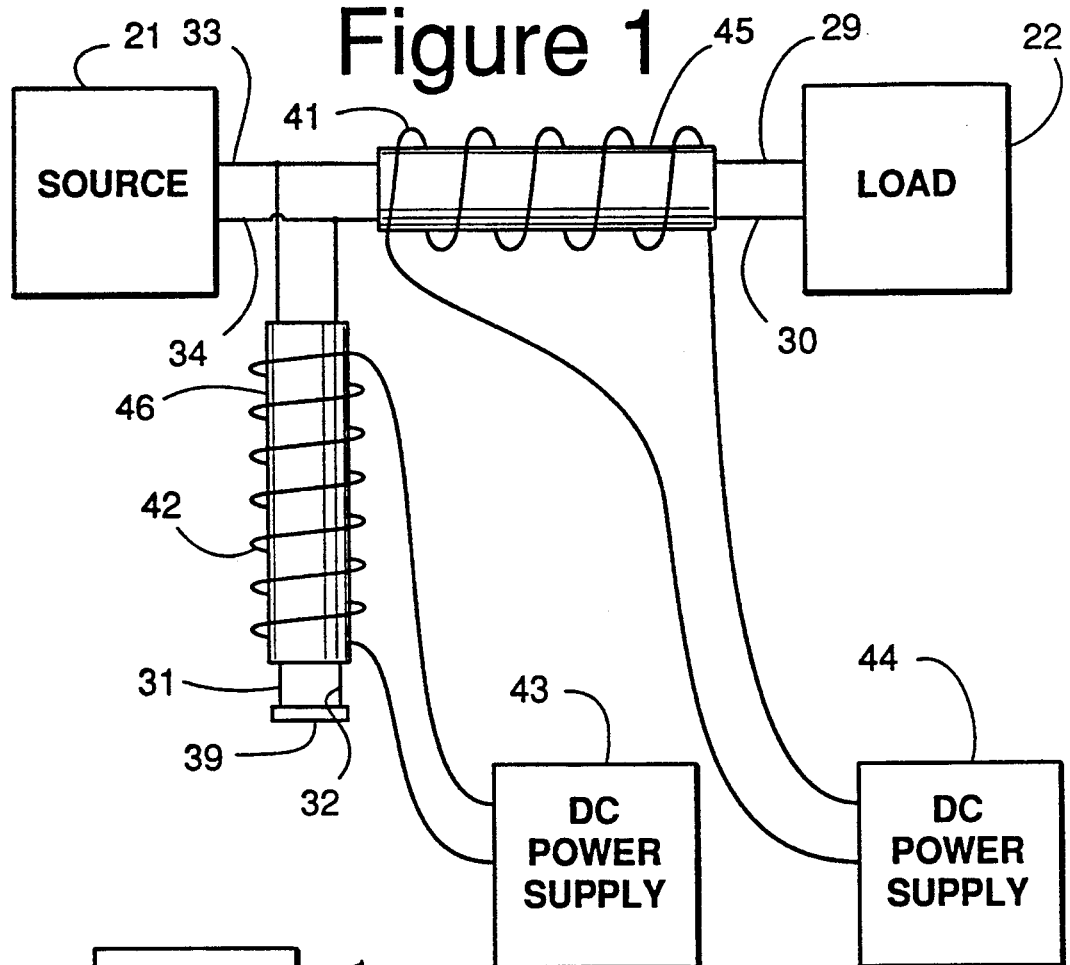
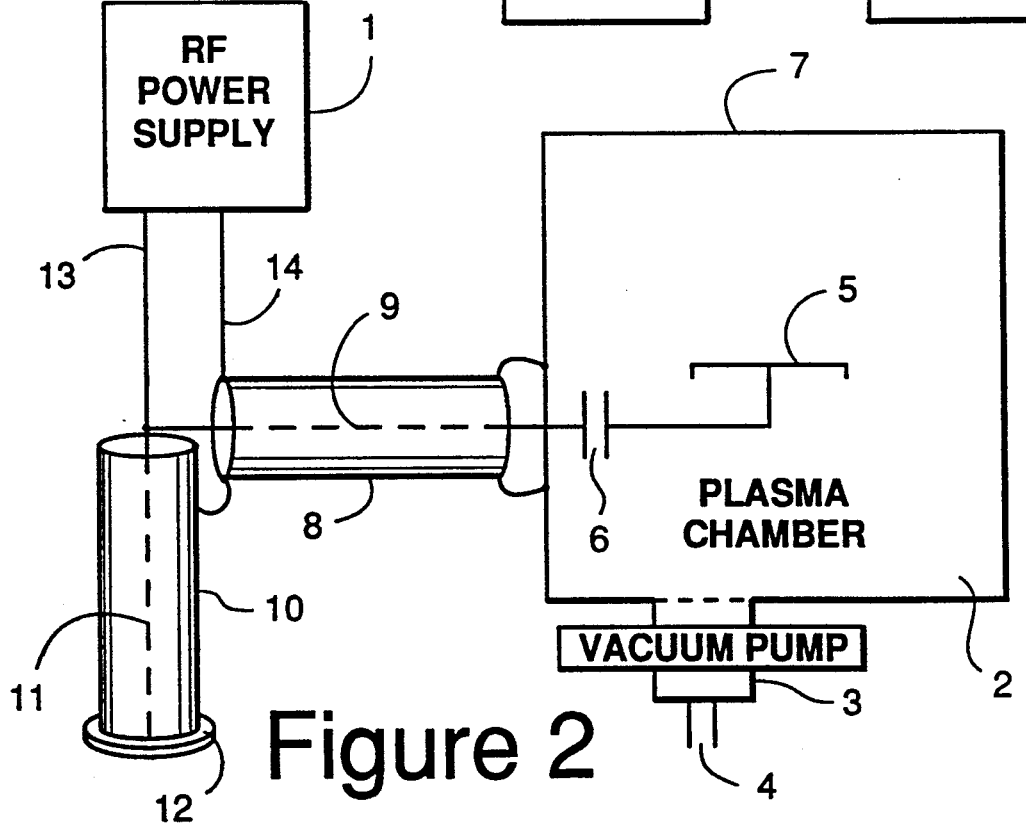

Figure 3
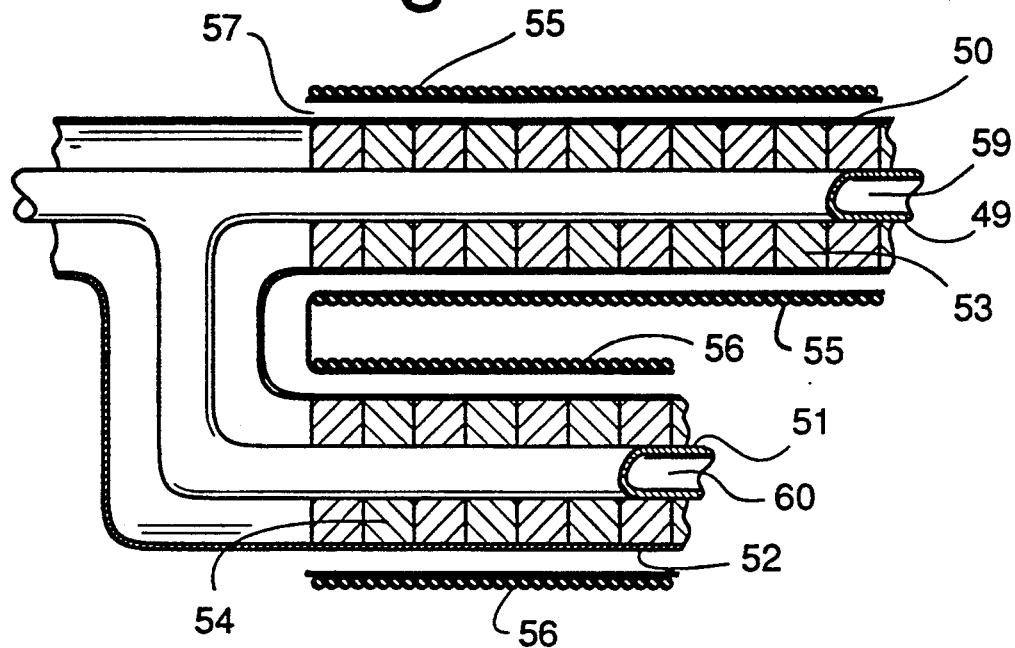
Figure 4
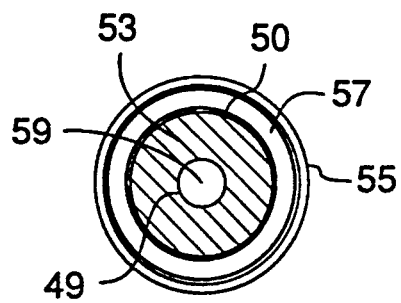
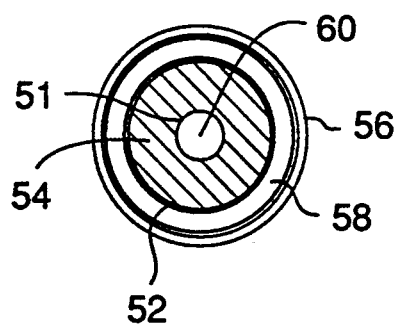

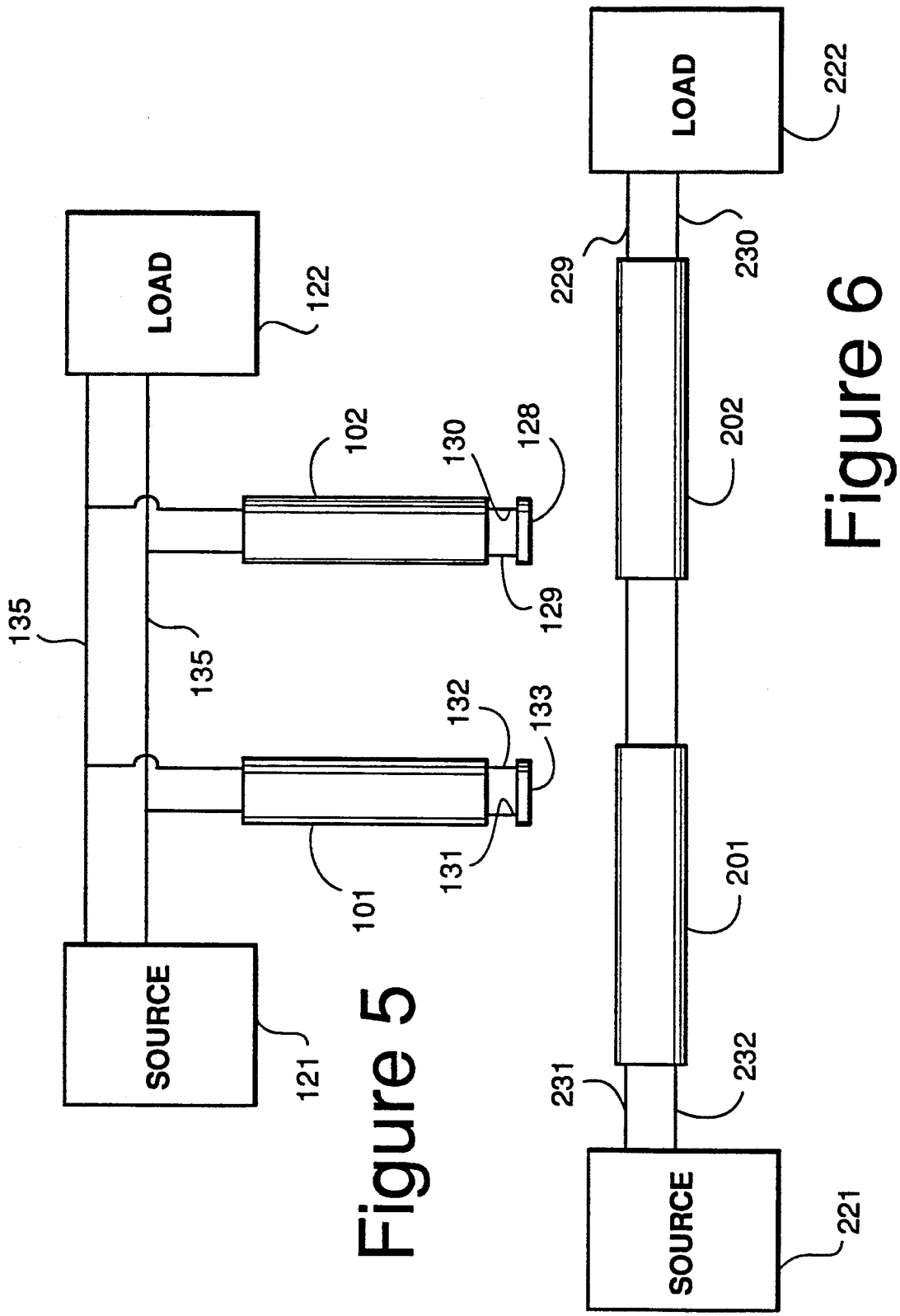

ELECTRONICALLY TUNED VHF/UHF MATCHING NETWORK

BACKGROUND

The present invention concerns the connection of a first electrical circuit to a second electrical circuit using a matching network so as to provide maximum power transfer between the first electrical circuit (the "source") and second electrical circuit (the "load").

Maximum power is transferred from the source to the load when the output impedance of the source is the complex conjugate of the input impedance of the load. In most cases the output impedance of the source is not naturally equal to the complex conjugate of the input impedance of the load; therefore, matching networks are placed between the source and load when power control and efficiency are critical. A matching network operates properly when the input impedance of the matching network is the complex conjugate of the output impedance of the source, and the output impedance of the matching network is the complex conjugate of the input impedance of the load. In this way power may be transferred from a source through a matching network to a load with minimal loss of power through power reflection, heat dissipation, etc.

In cases where the input impedance of the load varies during operation it is necessary to make adjustments to the matching network to maintain maximum power transfer from the source to the load. Typically, matching networks are designed such that variations in the input impedance of the load will result in a variation of the impedance of the matching network, the input impedance of the matching network being held constant. Further, in many applications the output impedance of a source is an output resistance with a negligible imaginary component. Therefore, in some prior art applications, the impedance magnitude and the impedance phase angle is measured at the input of the matching networks. Variable capacitors or inductors within the matching network are varied until the input impedance of the matching network matches the output impedance of the source network, that is until the impedance phase angle is zero and the impedance magnitude matches the magnitude of the output resistance of the source. The variable capacitors or inductors are placed in the matching network so that for every predicted variance in the input impedance of the load there is a solution in which the variable capacitors are set to values so that for the input of the matching network the impedance phase angle is zero and the impedance magnitude matches the magnitude of the output resistance of the source.

In U.S. Pat. No. 4,951,009 by Kenneth Collins et al., entitled "Turning Method and Control System for Automatic Matching Network", techniques are discussed in which variable impedance elements are used to replace variable capacitors and variable inductors. The variable impedance elements are constructed using magnetically saturable reactors, such as a transformer composed of primary and secondary windings wound around a non-linear ferromagnetic core.

Reflective power is removed by "dithering". What is meant by dithering is varying at a known frequency or frequencies the impedance through the first variable impedance element and the impedance through the second variable impedance element. A control circuit separates out the component of the change in reflected power which is due to dithering of the first variable impedance element from the change in reflected power which is due to dithering of the second variable impedance element. Using the components of change, the control circuit continuously varies the steady state impedance of the first variable impedance and the steady state impedance of the second variable impedance in directions which minimize the reflected power. The dithered method of tuning and control always converges to a unique matching solution, even for non-linear, dynamic loads. Convergence can be very fast by using high dither frequencies and magnetic dithering. The use of saturable reactors allows the variance of matching network impedance elements quickly and without moving parts.

While the matching network discussed in U.S. Pat. No. 4,951,009 works well for signals in the radio frequency range (frequency less than or equal to 30 Megahertz), for high power signals in the very high frequency (VHF) range (30-300 megahertz) or in the ultra high frequency (UHF) range (300-3000 megahertz), parasitic impedances within the magnetically saturable reactors are sufficiently large to cause non-ideal operational characteristics.

One alternate approach for matching networks which handle high power signals in the VHF or UHF range is to use a distributed parameter approach. In the distributed parameter approach transmission line sections or stubs are used to match impedances. In the prior art, the impedance of each transmission line stub may be varied by mechanically moving a short circuit or tap which is connected to the transmission line stub. However, when it is desired to quickly change impedances of a matching network, for example in a dithering process, such mechanical movement is unacceptably slow and unreliable.

SUMMARY OF THE INVENTION

In accordance with the preferred embodiment of the present invention, a matching network is presented. The matching network matches an output impedance of a source with an input impedance of a load. The matching network includes a plurality of transmission line stubs. Each transmission line stub includes a first transmission line conductor, a second transmission line conductor running parallel to but not in electrical contact with the first transmission line conductor, and ferrite dielectric material between the first transmission line conductor and the second transmission line conductor. A magnetic field is used to vary the relative permeability of the ferrite dielectric material. Throughout the discussion of the present invention, the term ferrite dielectric material means ferromagnetic or antiferromagnetic dielectric material.

In the preferred embodiment of the present invention the first transmission line conductor and the second transmission line are coaxial. These may be implemented by electrically conducting pipes placed one inside the other. Deionized water may be flowed through the inner pipe to remove heat generated by the transmission line stub. Alternately, some other fluid, such as air, may be flowed through the inner pipe to remove heat generated by the transmission line stub. Similarly air (or some other fluid such as deionized water) may be flowed on the outside of the outer electrically conducting pipe.

The transmission line stubs may be organized in a variety of topologies. For example, a first transmission line stub may extend from the source to the load. A second transmission line stub may have one end connected to the source and the other end terminated. Alternately, two or more transmission line stubs may be connected in series between the source and the load. Another topology is to connect the source directly to the load and connect a first end of one or more transmission line stubs to the connection between the source and the load. The unconnected end of each transmission line stub would be terminated by a short circuit, open circuit, or other circuit of known admittance.

A matching network designed according to the preferred embodiment of the present invention may be tuned by minimizing phase and magnitude errors, as described herein, or may be tuned by minimizing the power reflected from the input of the matching network toward the source, as in the dithering technique described in U.S. Pat. No. 4,951,009, referenced above.

BRIEF DESCRIPTION OF THE DRAWINGS

FIG. 1 shows an electronically tuned VHF/UHF matching network in accordance with the preferred embodiment of the present invention.

FIG. 2 shows a electronically tuned matching network as shown in FIG. 1 used in a system which supplies power to a plasma process in accordance with the preferred embodiment of the present invention.

FIG. 3 and FIG. 4 show cross-sectional views of a design implementation of an electronically tuned matching network as shown in FIG. 2 in accordance with the preferred embodiment of the present invention.

FIG. 5 shows an electronically tuned VHF/UHF matching network in accordance with an alternate preferred embodiment of the present invention.

FIG. 6 shows an electronically tuned VHF/UHF matching network in accordance with another alternate preferred embodiment of the present invention.

DESCRIPTION OF THE PREFERRED EMBODIMENT

In FIG. 1, a source 21 is shown connected to a load 22 through an electronically tuned VHF/UHF matching network. The electronically tuned VHF/UHF matching network consists of a transmission line stub 45 and a transmission line stub 46, arranged in the shown topology.

Transmission line stub 45, in general, may be of any transmission line type with two conductors separated by a ferrite dielectric material. Throughout the discussion of the present invention, the term ferrite dielectric material means ferromagnetic or antiferromagnetic dielectric material. For example transmission line stub 45 may be twin leads with a ferrite dielectric material between each of the twin leads. Alternately transmission line stub 45 may be coaxial.

In FIG. 1, transmission line stub 45 is shown to consist of a transmission line conductor 29 and a transmission line conductor 30 separated by a ferrite dielectric material. A magnetic field is applied to transmission line stub 45 by a current supplied by DC power supply 44 through a wire 41 wrapped around transmission line stub 45. Varying the current through wire 41, and thus the magnetic field applied to transmission line stub 45, varies the relative permeability of transmission line stub 45.

Transmission line stub 46 consists of a transmission line conductor 31 and a transmission line conductor 32 separated by a ferrite dielectric material. A magnetic field is applied to transmission line stub 46 by a current supplied by DC power supply 43 through a wire 42 wrapped around transmission line stub 46. Varying the current through wire 42, and thus the magnetic field applied to transmission line stub 46, varies the relative permeability of transmission line stub 46. A terminator 39 of transmission line stub 46 may be, for example, a short circuit, an open circuit or some other circuit with a predetermined admittance. The admittance of terminator 39 is herein referred to as termination admittance. For the purpose of calculating the input admittance, the termination admittance of terminator stub 45 is the admittance of load 22. Also, throughout the following discussion, values are given in terms of admittance, rather than its inverse (impedance), in order to simplify the formulas used in the discussion.

The matching network is adjusted so that admittance $(Y_{in})$ between a line 33 and a line 34 of the matching network is equal to the output admittance $(Y_g)$ of source 21. This may be done in two steps. In the first step, the magnetic field applied to transmission stub 45 is varied so that the admittance of transmission stub 45 between line 33 and 34 is equal to $Y_g + / -jB$, where B is a constant and j is the imaginary number $(-1)^{\frac{1}{2}}$. In the second step, the magnetic field applied to transmission stub 46 is varied so that the admittance of transmission stub 46 between line 33 and 34 is equal to $-/+jB$. Thus the admittance of transmission stub 46 cancels out the imaginary component of the admittance of transmission line stub 45 and leaves the total admittance of the matching network to be $Y_g$.

FIG. 2 shows a matching network of the type shown in FIG. 1 applied to a system which is used in a plasma process inside a plasma chamber 2. The load of the system is generated by the voltage across an electrode 5 and walls 7 of plasma chamber 2, which act as a separate electrode. A capacitor 6, typically between 10 and 100 picofarads isolates a dc voltage component on electrode 5 from the matching network. The matching network matches the output admittance between a line 13 and a line 14 of a power supply 1. A first transmission line stub of the matching network includes a coaxial transmission line conductor 9 enclosed by a coaxial transmission line conductor 8. A second transmission line stub of the matching network includes a coaxial transmission line conductor 11 enclosed by a coaxial transmission line conductor 10. As shown in FIG. 2, coaxial transmission line conductor 9 is electrically connected to capacitor 6, coaxial transmission line conductor 11 and line 13 of power supply 1. Also, coaxial transmission line conductor 8 is shown electrically connected to coaxial transmission line conductor 10, line 14 of power supply 1, and walls 7 of plasma chamber 2. A short circuit, such as a disk 12, is used to electrically connect coaxial transmission line conductor 11 to coaxial transmission line conductor 10 as shown. A vacuum pump 3 is used to pump out gasses within plasma chamber 2 through a conduit 4.

FIG. 3 shows a cross-sectional side view of a possible implementation of the matching network shown in FIG. 2. Coaxial transmission line conductor 9 may be implemented using a copper tube 49 having an outside radius of approximately 0.0095 meters and a length as calculated below. Coaxial transmission line conductor 8 may be implemented using a copper pipe 50 having an inside radius of approximately 0.0159 meters and a length as calculated below. A ferrite dielectric 53 is placed between copper tube 49 and copper pipe 50. Ferrite dielectric 53 may be for example, a plurality of ferrite toroidal cores, available as part number M3-665 from National Magnetics Group, Inc. having a business address of 250 South Street, Newark, N.J. 07114. A magnetic field, used to vary the relative permeability of ferrite dielectric 53, is generated by current through a solenoid coil 55 wrapped around copper pipe 50 as shown. Solenoid coil 55 is made of, for example, enamel, insulated, tightly wove 8 AWG copper wire. During operation the transmission stub is cooled by deionized water flowing within a center region 59 of copper tube 49, and by air flow through an open region 57 between copper pipe 50 and solenoid coil 55. While solenoid coil 55 may be placed directly upon copper pipe 50, in the preferred embodiment open region 57 exists to allow fluid to pass between solenoid coil 55 and copper pipe 50.

Coaxial transmission line conductor 11 may be implemented using a copper tube 51 having an outer radius of approximately 0.0095 meters and a length as calculated below. Coaxial transmission line conductor 10 may be implemented using a copper pipe 52 having a inner radius of approximately 0.0195 meters and a length as calculated below. A ferrite dielectric 54 is placed between copper tube 51 and copper pipe 52. Ferrite dielectric 54 may be for example, a plurality of ferrite toroidal cores, available as part number M3-665 from National Magnetics Group, Inc. having the business address given above. A magnetic field, used to vary the relative permeability of ferrite dielectric 54, is generated by current through a solenoid coil 56 wrapped around copper pipe 52 as shown. Solenoid coil 56 is made of, for example, tightly enamel, insulated wove 8 AWG copper wire. During operation the transmission stub is cooled by deionized water (or some other fluid such as air) flowing within a center region 60 of copper tube 51, and by air flow (or the flow of some other fluid such as deionized water) through an open region 58 between copper pipe 52 and solenoid coil 56. While solenoid coil 56 may be placed directly upon copper pipe 52, in the preferred embodiment open region 58 exists to allow fluid to pass between solenoid coil 56 and copper pipe 52.

FIG. 4 shows another cross-sectional front view of the matching network shown in FIG. 3. The cross-sectional view shown in FIG. 4 is along an axis perpendicular to the axis of the cross-sectional view shown in FIG. 3.

In general, for each of the transmission line stubs shown in FIG. 3, the characteristic admittance of the transmission line ($Y_o$) may be calculated by the following formula:

$$Y_o = 2\pi/(((\mu^*\mu_o)/(\epsilon^*\epsilon_o))^{\frac{1}{2}} \ln[r_o/r_i])$$

where:
- $\mu_o$ = permeability of free space ($4\pi \times 10^{-7}$ Henry/meter).
- $\mu$ = relative permeability of the ferrite dielectric between the inner and the outer conductors.
- $\epsilon_o$ = permittivity of free space ($8.86 \times 10^{-12}$ Farad/meter)
- $\epsilon$ = relative permittivity of the ferrite dielectric between the inner and the outer conductors (dielectric constant).
- $r_o$ = radius of the outer conductor (meters)
- $r_i$ = radius of the inner conductor (meters).

Once the characteristic admittance of the transmission line stub is calculated, the input admittance of the transmission line stub ($Y_{in}$) may be calculated using the following formula:

$$Y_{in} = Y_o[(Y_r + jY_o \tan(a))/(Y_o + jY_r \tan(a))]$$

where:
- $Y_r$ = termination admittance of the transmission line stub (Siemens)
- $j = (-1)^{\frac{1}{2}}$
- $a = 2\pi(\mu^*\epsilon)^{\frac{1}{2}}(d/\lambda)$
- $d$ = length of the transmission line stub (meters)
- $\lambda$ = free space wavelength of the signal through the transmission line stub (c/f) (meters)
- $c$ = free space speed of light ($300 \times 10^6$ meters/second)
- $f$ = frequency of oscillation of the signal through the transmission line stub (Hertz).

A three step formula may be used in the designing of a matching network such as that shown in FIG. 3. In the first step, ferrite dielectric material for constructing ferrite dielectric 53 and ferrite dielectric 54 is chosen. In selecting the ferrite dielectric material it is important to select material which will have a low loss and a high relative permeability in the operating frequency range of the matching network. Solenoid coil 55 and solenoid coil 56 will respectively vary ferrite dielectric 53 and ferrite dielectric 54 between a minimum relative permeability ($\mu_{min}$) and a maximum relative permeability ($\mu_{max}$).

In the second step, the length of copper tube 49 and copper pipe 50 of the first transmission line stub is determined by iteration so that the real component of $Y_{in}$ of the first transmission line stub may be made equal to $Y_g$ over the range solenoid coil 55 varies the relative permeability of ferrite dielectric 53. Then the length of copper tube 51 and copper pipe 52 of the second transmission line stub is determined by iteration so that the imaginary component of $Y_{in}$ of the first transmission line stub may be canceled over the range solenoid coil 56 varies the relative permeability of ferrite dielectric 54.

When making the iterative determination of the length ($d_1$) of the first transmission line stub a good first guess is three fourths the wavelength of the signal through the first transmission line stub when the relative permeability of ferrite dielectric 53 is at its maximum value. That is when:

$$d_1 = \tfrac{3}{4}(\lambda/(\epsilon^*\mu_{max})^{\frac{1}{2}}) \text{ (meters)}$$

When making the iterative determination of the length ($d_2$) of the second transmission line stub a good first guess is one half the wavelength of the signal through the second transmission line stub when the relative permeability of ferrite dielectric 54 is at its maximum value. That is when:

$$d_2 = \tfrac{1}{2}(\lambda/(\epsilon^*\mu_{max})^{\frac{1}{2}}) \text{ (meters)}$$

In the third step, the number of turns of solenoid coil 55, the number of turns of solenoid coil 56, the maximum current through solenoid coil 55 and the maximum current through solenoid coil 56 is determined so that a magnetic field of sufficient strength may be generated to reach the desired minimum relative permeability of ferrite dielectric 53 and ferrite dielectric 54.

What follows is an example of the design of a typical system in which $Y_g=0.02$ Siemens, the maximum signal frequency is 100 megahertz and the load admittance has a real component only which varies from 0.05 Siemens to 0.5 Siemens. For both the first transmission line stub and the second transmission line stub $r_o$ is selected to be 0.0159 meters; and $r_i$ is selected to be 0.095 meters.

Ferrite dielectric 53 and ferrite dielectric 54 are selected to be made from a plurality of ferrite toroidal cores, available as part number M3-665 from National Magnetics Group, Inc. This material has a maximum permeability ($\mu_{max}$) of 20 when there is no magnetic field applied to it and a minimum permeability ($\mu_{min}$) of 5 when an external magnetic flux density (B) of 1000 gauss is applied.

The length of the first transmission line stub is chosen to be three-fourths the wavelength of the signal through the first transmission line stub when the relative permeability of ferrite dielectric 53 is at its maximum value ($\mu_{max}=20$), in this case the length equals 0.185 meters.

A check is made to see that at the maximum frequency (100 megahertz) and for the range of variation of load admittance, permeability of ferrite dielectric 53 may be varied between $\mu_{max}$ (20) and $\mu_{min}$ (5) to generate a real component of $Y_{in}$ of the first transmission line stub that equals $Y_g$ (0.02 Siemens). The check verifies that the length is acceptable because at the minimum load admittance of 0.05 Siemens, when permeability ($\mu$) of ferrite dielectric 53 is 13.5, $Y_{in}$ equals $0.019-j(0.015)$; and, at the maximum load admittance of 0.5 Siemens, when permeability ($\mu$) of ferrite dielectric 53 is 10.3, $Y_{in}$ equals $0.019-j(0.092)$.

Next, the length of the second transmission line stub is chosen to be one-half the wavelength of the signal through the second transmission line stub when the relative permeability of ferrite dielectric 54 is at its maximum value ($\mu_{max}=20$), in this case the length equals 0.125 meters.

A check is made to see that at the maximum frequency (100 megahertz) and for the range of variation of load admittance, permeability of ferrite dielectric 54 may be varied between $\mu_{max}$ (20) and $\mu_{min}$ (5) to generate an imaginary component of $Y_{in}$ of the second transmission line stub that cancels out the imaginary component of $Y_{in}$ of the first transmission line. The check verifies that the length is acceptable. The imaginary component of $Y_{in}$ of the first transmission line varies between $-j(0.015)$ when the load admittance is 0.05 Siemens and $-j(0.092)$ when the load admittance is 0.5 Siemens. This range is covered. Specifically, when permeability ($\mu$) of ferrite dielectric 54 is 7.0, $Y_{in}$ of the second transmission line is $+j(0.012)$. Similarly, when permeability ($\mu$) of ferrite dielectric 54 is 16.5, $Y_{in}$ of the second transmission line is $+j(0.103)$. Thus the chosen lengths of the first transmission line stub and the second transmission line stub are acceptable.

In order to generate a magnetic flux density of 1000 gauss when $r_o$ is 0.0159 meters and $r_i$ is 0.095 meters, solenoid coil 55 and solenoid coil 56 are required to produce a maximum magnetic field intensity (H) of 96,000 amperes-turns per meter. This may be accomplished, for example, by setting current through solenoid coil 55 and solenoid coil 56 to have a maximum value of 40 amperes, and constructing solenoid coil 55 and solenoid coil 56 to have 2400 turns per meter.

Applicant's invention may be applied to a variety of matching network topologies. For example, in FIG. 5, a matching network, consisting of a transmission line stub 101 and a transmission line stub 102 connected in parallel, is shown between a source 121 and a load 122. Transmission line stub 101 includes a transmission line conductor 131, a transmission line conductor 132 and a terminator 133. Transmission line stub 102 includes a transmission line conductor 129, a transmission line conductor 130 and a terminator 128. A transmission line 135 connects source 121 to load 122.

For best operation of the two stub system shown in FIG. 5, the part of transmission line extending from source 121 to the connection of stub 101 should have a characteristic admittance equal to the output admittance of the source. Further, for best tuning range, the length of transmission line 135 measured from the connection of stub 101 to the connection of stub 102 should be three-eighths of a wavelength of the signal generated by source 121, and the length of transmission line 135 measured from the connection of stub 102 to load 122 should be three-eighths of a wavelength of the signal generated by source 121.

Alternatively, in FIG. 6, a matching network, consisting of a transmission line stub 201 and a transmission line stub 202 connected in series, is shown between a source 221 and a load 222. Transmission line stub 201 includes a transmission line conductor 231 and a transmission line conductor 232. Transmission line stub 202 includes a transmission line conductor 229 and a transmission line conductor 230.

We claim:

1. A transmission line stub in a matching network coupled between a power supply and electrodes used in a plasma process, the transmission line stub comprising:
    a first electrically conducting pipe;
    a second electrically conducting pipe, the second electrically conducting pipe being placed inside the first electrically conducting pipe;
    ferrite dielectric material between the first electrically conducting pipe and the second electrically conducting pipe, the ferrite dielectric material being in thermal contact with the first electrically conducting pipe and the second electrically conducting pipe;
    variance means for changing the relative permeability of the ferrite dielectric material; and,
    cooling means for cooling the second electrically conducting pipe and the ferrite dielectric material, the cooling means including fluid flowing through the second electrically conducting pipe.

2. A transmission line stub as in claim 1, wherein the fluid flowing though the second electrically conducting pipe is deionized water.

3. A transmission line stub as in claim 1 wherein the variance means includes a magnetic field generator which comprises:
    wire wrapped around the first electrically conducting pipe, the second electrically conducting pipe and the ferrite dielectric material; and,
    a current generating means for generating current through the wire.

4. A transmission line stub as in claim 3 additionally comprising flow means for flowing fluid between the wire and the first electrically conducting pipe.

5. A transmission line stub as in claim 4 wherein the fluid flowing between the wire and the first electrically conducting pipe is air.

6. A matching network with a plurality of transmission line stubs, the matching network being coupled between a power supply and electrodes used in a plasma process, wherein each transmission line stub comprises:
   a first electrically conducting pipe;
   a second electrically conducting pipe, the second electrically conducting pipe being placed inside the first electrically conducting pipe;
   ferrite dielectric material between the first electrically conducting pipe and the second electrically conducting pipe;
   variance means for changing the relative permeability of the ferrite dielectric material; and,
   cooling means for cooling the second electrically conducting pipe and the ferrite dielectric material, the cooling means including fluid flowing through the second electrically conducting pipe.

7. A matching network as in claim 6 wherein the variance means includes a magnetic field generator which comprises:
   wire wrapped around the first electrically conducting pipe, the second electrically conducting pipe and the ferrite dielectric material; and,
   current generating means for generating current through the wire.

8. A matching network as in claim 6 wherein wherein a first transmission line stub from the plurality of transmission line stubs is coupled between the power supply and the the electrodes, and wherein a first end of a second transmission line stub from the plurality of transmission line stubs is coupled to the power supply and a second end of the second transmission line stub is coupled to a terminator.

9. A matching network as in claim 8 wherein the terminator is a short circuit electrically coupling a first electrically conducting pipe of the second transmission line stub to a second electrically conducting pipe of the second transmission line stub.

10. A matching network as in claim 6 wherein a first transmission line stub from the plurality of transmission line stubs and a second transmission line stub from the plurality of transmission line stubs are coupled in series between the power supply and the the electrodes.

11. A matching network as in claim 6 wherein a first end of a first transmission line stub from the plurality of transmission line stubs is coupled to a connecting transmission line connecting the power supply to the the electrodes, and a second end of the first transmission line stub is coupled to a first terminator, and wherein a first end of a second transmission line stub from the plurality of transmission line stubs is coupled to the connecting transmission line and a second end of the second transmission line stub is coupled to a second terminator.

12. A matching network as in claim 6, wherein the fluid flowing through the second electrically conducting pipe is deionized water.

13. A matching network as in claim 6 wherein each transmission line stub additionally comprises flow means for flowing fluid between the wire and the first electrically conducting pipe.

14. A matching network as in claim 13 wherein the fluid flowing between the wire and the first electrically conducting pipe is air.

15. A matching network as in claim 6 wherein second electrically conducting pipes from each of the transmission line stubs in the plurality of transmission line stubs are connected together so as to form a fluid flow path through the second electrically conducting pipes.

16. A method for providing a matching network between a power supply and electrodes used in a plasma process, the matching network including a plurality of transmission line stubs, each transmission line stub including a first electrically conducting pipe and a second electrically conducting pipe, the second electrically conducting pipe being placed inside the first electrically conducting pipe, the method comprising the step of:
   (a) placing ferrite dielectric material in contact with and between the the first electrically conducting pipe and the second electrically conducting pipe in each transmission line stub;
   (b) varying the permeability of the ferrite dielectric material; and,
   (c) cooling the second electrically conducting pipe and the ferrite dielectric material by flowing fluid through the second electrically conducting pipe.

17. A method as in claim 16 wherein step (b) is performed by varying a magnetic field placed around each transmission line stub.

18. A method as in claim 16 wherein the fluid is deionized water.

19. A method as in claim 16 additionally comprising the step of:
   (d) flowing fluid over the first electrically conducting pipe for cooling.

20. A method as in claim 19 wherein in step (d) the fluid is air.

21. A method as in claim 16 wherein step (c) includes connecting second electrically conducting together pipes from each of the transmission line stubs in the plurality of transmission line stubs so as to form a fluid flow path through the second electrically conducting pipes.

* * * * *